United States Patent
Costrini et al.

(10) Patent No.: US 6,985,384 B2
(45) Date of Patent: Jan. 10, 2006

(54) SPACER INTEGRATION SCHEME IN MRAM TECHNOLOGY

(75) Inventors: Gregory Costrini, Hopewell Junction, NY (US); John Hummel, Millbrook, NY (US); Kia-Seng Low, Hopewell Junction, NY (US); Igor Kasko, Mennecy (FR); Frank Findeis, Munich (DE); Wolfgang Raberg, Fontainebleau (FR)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 10/261,709

(22) Filed: Oct. 1, 2002

(65) Prior Publication Data

US 2004/0063223 A1 Apr. 1, 2004

(51) Int. Cl.
*G11C 11/18* (2006.01)

(52) U.S. Cl. .................. 365/173; 365/174; 365/182; 365/208; 365/209; 365/212; 257/295; 257/296; 257/421; 257/422

(58) Field of Classification Search .............. 257/295, 257/296, 421, 422, 752; 365/173, 174, 182, 365/208, 209, 212
See application file for complete search history.

(56) References Cited

U.S. PATENT DOCUMENTS

| | | | |
|---|---|---|---|
| 5,640,343 A | 6/1997 | Gallagher et al. | |
| 5,650,958 A | 7/1997 | Gallagher et al. | |
| 5,734,605 A | 3/1998 | Zhu et al. | |
| 5,804,458 A | 9/1998 | Tehrani et al. | |
| 5,828,598 A | 10/1998 | Chen et al. | |
| 5,838,608 A | 11/1998 | Zhu et al. | |
| 6,034,887 A | 3/2000 | Gupta et al. | |
| 6,097,625 A | 8/2000 | Scheuerlein | |
| 6,174,737 B1 | 1/2001 | Durlam et al. | |
| 6,252,796 B1 | 6/2001 | Lenssen et al. | |
| 6,358,756 B1 | 3/2002 | Sandhu et al. | |
| 6,365,419 B1 | 4/2002 | Durlam et al. | |
| 6,385,082 B1 | 5/2002 | Abraham et al. | |
| 6,538,919 B1 | 3/2003 | Abraham et al. | |
| 6,590,806 B1 * | 7/2003 | Bhattacharyya | 365/173 |
| 6,680,500 B1 * | 1/2004 | Low et al. | 257/295 |

FOREIGN PATENT DOCUMENTS

| | | |
|---|---|---|
| EP | 1248305 A | 10/2002 |
| JP | P2000-195251 A | 7/2000 |

* cited by examiner

Primary Examiner—David Nelms
Assistant Examiner—Renee R. Berry
(74) Attorney, Agent, or Firm—Eric Petraske; Margaret A. Pepper

(57) ABSTRACT

A magneto resistive memory device is fabricated by etching a blanket metal stack comprised of a buffer layer, pinned magnetic layer, a tunnel barrier layer and a free magnetic layer. The problem of junction shorting from resputtered metal during the etching process is eliminated by formation of a protective spacer covering the side of the freelayer and tunnel barrier interface. The spacer is formed following the first etch through the free layer which stops on the barrier layer. After spacer formation a second etch is made to isolate the device. The patterning of the device tunnel junction is made using a disposable mandrel method that enables a self-aligned contact to be made following the completion of the device patterning process.

10 Claims, 2 Drawing Sheets

SPACER INTEGRATION SCHEME IN MRAM TECHNOLOGY

TECHNICAL FIELD

The field of the invention is that of magnetic random access memory (MRAM), in particular the design of an array device to improve the fabrication process yield.

BACKGROUND OF THE INVENTION

Magneto resistive tunnel junction devices used in a random access memory array are formed by depositing a blanket metal stack comprised of a pinned magnetic layer, a tunnel barrier layer and a free magnetic layer, such as that described in U.S. Pat. No. 5,650,958. Several process steps are made to define the magneto resistive tunnel junction device that comprises the storage element of a memory array cell. The bit is written by orienting the net magnetic moment of the free layer parallel or antiparallel to the pinned layer magnetic moment. The bit is read by sensing the amount of current tunneling through the barrier junction from the free layer to the pinned layer. The two bit states correspond to the junction resistance of the parallel and antiparallel orientations of the freelayer relative to the pinned layer.

In practice, the operation of the tunnel barrier device is more complicated than the simple model described above. In a product array of magneto resistive tunnel barrier devices, variations in the orientation of the freelayer magnetic moment, in nominally the same state, introduce additional noise that the sense amplifiers must discern. Defects generated in the sidewalls during the fabrication process can impart the tendency of the magnetic domains to orient in offaxis orientations. The reduction of these variations by process improvements is desirable as this results in larger signal margins in a product array. Additional performance is obtained by increasing the signal margin.

Workers in the field are aware that during the reactive ion etching (or dry etching) process of patterning the stack, the reactive ions cause exposed metal to sputter. Some of the sputtered material lands on the exposed sides of the upper layers of the etched stack. Metal deposited across the tunnel barrier can cause an excessive leakage or shunt path along the exposed vertical etched surface that forms the sidewall of the storage device. This can result in a defective bit in the memory storage array. This problem is more pronounced for the cross point memory architecture, in which the interconnect metal, usually copper, is exposed during the device etch increasing the probability for shorting the junction.

SUMMARY OF THE INVENTION

The invention relates to a method for fabricating a magneto-resistive tunnel junction device for use in a memory cell, in which a set of sidewalls protects exposed edges of sensitive layers during etching.

A feature of the invention is the passivation of the external edges of exposed ferromagnetic layers.

Another feature of the invention is the formation of sidewalls along the edges of a temporary mandrel that supports the sidewalls and provides a contact into the cell.

DETAILED DESCRIPTION

Figure 1:
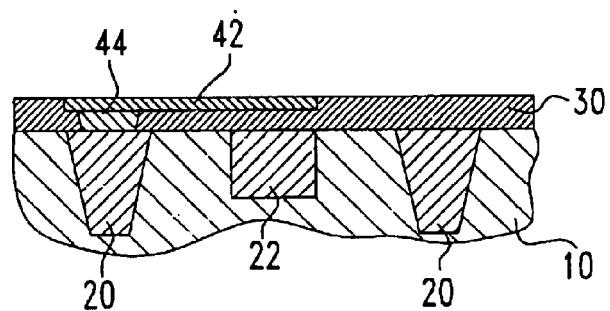
FIGS. 1–8 show in partially pictorial, partially schematic form, cross sections of portions of a magneto resistive tunnel junction device, illustrating the process sequence made to define the invention described herein.

Referring to FIG. 1, there is shown in cross section a portion of an integrated circuit that is being prepared for construction of an MRAM cell, part of a memory array. Substrate 10, illustratively silicon, has been prepared by forming wells, threshold implants, etc. as part of standard integrated circuit processing up to at least the first level of interconnect dielectric deposition.

In the portion illustrated here, conductive interconnection members 20 and 22 have been formed in substrate 10 by damascene processing. To form the next wiring layer, a dielectric layer, e.g. oxide 30 has been put down and a via 44 and local device wiring interconnect 42 have been formed. Illustratively, they are TaN, but any other conductive material compatible with standard processing, e.g. copper, tungsten or aluminum, could be used. The top surface of the local device wiring interconnect 42 has been planarized by chemical-mechanical polishing (CMP) as is standard in the field. This surface is critical to optimal MRAM device performance and care must be made to mitigate surface roughness.

Figure 2A:
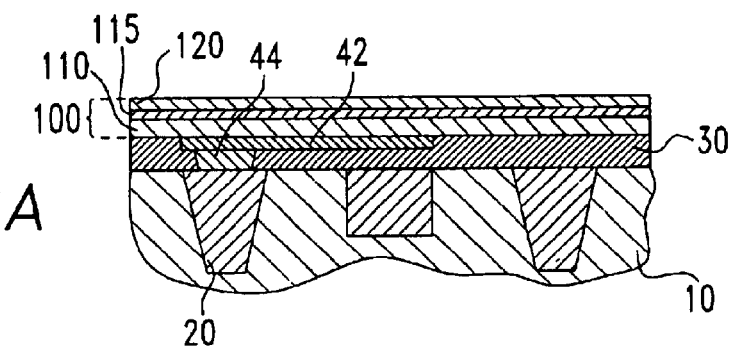
Figure 2B:
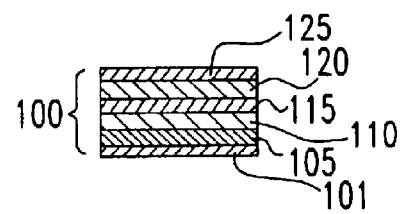

A blanket stack of magnetic material, denoted generally by the numeral 100, has been deposited to form the basis for the array of MRAM devices. Stack 100 shows the generic three layers of a magnetic memory cell—the pinned layer (110), the tunnel barrier layer (115) and the free layer (120). Each of these layers may be a composite of several sublayers, as shown in U.S. Pat. No. 5,650,958, assigned to the assignee hereof. For example, as shown in FIG. 2B, layer 110 in the Figures represents schematically the ferromagnetic pinned layer of the cell, plus additional layers such as a buffer layer 101 on the bottom of layer 110 (e.g. TaN), and a pinning layer 105 (e.g. PtMn or IrMn,) placed between the buffer layer and the pinned layer, as well as the ferromagnetic pinned layer 110 of CoFe. In the middle of the device, a dielectric tunnel barrier layer 115 (e.g. alumina) separates the two magnetic conductive layers. At the top of the device, the free layer (e.g. NiFe permalloy, TaN or bilayer Ta/TaN) 120 may also include a cap layer 125. Free layer 120 may be, for example, a layer of permalloy (NiFe). The tunnel barrier layer 115 is usually alumina (Al2O3) but any other material providing tunnel barrier characteristics may also be used. The pinned layer 110 may be a single layer of CoFe or a composite of CoFe/Ru layers, for example. Other ferromagnetic materials may be used in place of those described herein to perform the same device function. For example, other alloy compositions of CoFe are employed as pinned ferromagnetic layers and also alloys of CoFe alloyed with B, Si, for example are used for the freelayer 120.

In the course of fabricating a magneto resistive tunnel junction device to form a random access memory cell, a layer of appropriate magnetic materials is etched to define sections of appropriate dimension. The tunnel junction of the device is defined by etching the free magnetic layer and stopping on the tunnel barrier layer. Following the formation of the tunnel junction, a protective spacer covering the edges of the free layer and tunnel barrier interface is fabricated before a second etch is made to either isolate the devices or to etch through the pinned magnetic layer beneath the junction. In this case the second etch process is self-aligned to the first, which improves the symmetry of the magnetic flux that couples the softlayer to the hard or pinned layer on the bottom interface of the tunnel barrier. This improves the electrical switching characteristics of the device.

An advantageous feature of the invention is a temporary mandrel that enables the formation of a self-aligned vertical electrode for contact to the free layer of the device. The disposable mandrel is used to support an etch mask in the form of a spacer along the sidewall of the mandrel and the etched freelayer to the tunnel barrier interface. An advantage of this method is that the height if the mandrel can be substantial, which allows the formation of a sufficient etch mask with a thin sidewall. This feature is not required, however, for the sidewall spacer formation and a more traditional approach using a conductive hardmask, such as TiN or TaN, can also be used.

Another advantage of the invention is the formation of a passivation layer, which reduces pinning of magnetic domains in the free layer from imperfections in the device sidewall. Ideally, this reduction of pinning allows the freelayer to switch into two distinct predefined states thereby providing improved signal-to-noise conditions for the array sense amplifier. It is necessary for such signal improvement that the material surrounding the mandrel be deposited directly onto the exposed surface of the junction which is the case for spacer deposition according to the invention. Utilizing the sidewall spacer to provide junction passivation permits this additional requirement to be satisfied independent of the choice of interlevel dielectric material, e.g. alumina or nitride.

The junction protection provided by the sidewall spacer of the invention is particularly useful for the formation of a cross point memory array directly on copper wiring. This cell architecture requires the fabrication of the magnetoresistive device directly on the interconnect wiring beneath the device. The fabrication of this device requires etching completely through the magnetic metal stack, thereby exposing the copper metal interconnect. The sputter yield of copper is relatively large, which increases the rate of redeposited metal during etch thereby increasing the probability of junction shorting. By providing a dielectric spacer along the sidewall of the tunnel junction, the potential for sidewall shorting is substantially reduced.

As those skilled in the art are aware, the bit stored in the cell is read by flowing current through the tunnel barrier of the device from a contact shown in later figures through stack 100 and then through interconnections 42, 44 and 20. The bit is written by flowing a current horizontally in the figure through adjacent interconnect wiring below and above the device, e.g. wiring interconnect 22 and one of the layers in the stack, also as is conventional for the magneto resistive device design illustrated in the figures. The so-called offset cell architecture features a magneto resistive device wired in series with a transistor to provide increased signal and faster access time. The crosspoint device design wires the magneto resistive device between adjacent wiring levels in an integrated circuit which results in a common bottom contact for the read and write operations.

Figure 3:
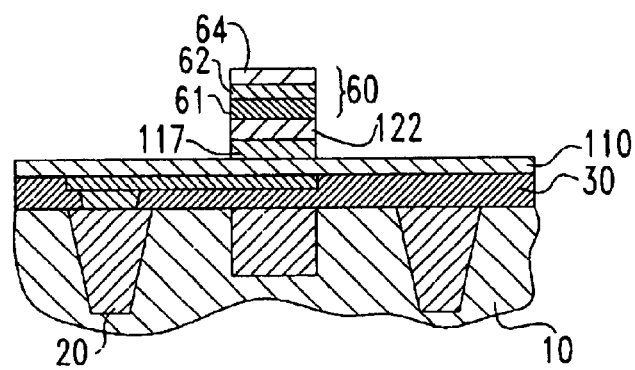

Referring to FIG. 3, an illustrative cell in the array is patterned by first forming a mandrel 60 on the stack of magnetic materials, the mandrel comprising a spinon glass 61 (SOG,) a dielectric mask bottom layer of nitride 62 and an upper layer of oxide 64. Alternative hardmask materials, such as TiN or TaN, may similarly be used in the patterning process, as those skilled in the art are aware. In the manufacturing sequence, the mandrel hardmask 60 for the subsequent metal etch process is formed and the magnetic layers are etched using the mandrel as a mask. The ferromagnetic freelayer 120 is etched, stopping on the tunnel layer 115 to define cell layers 122 and 117, respectively, shown in FIG. 3. Alternatively, the freelayer etch process could etch through the tunnel barrier layer 115 and pinned layer 110 stopping on or in the pinning layer that is a lower level in the composite layer 110.

Illustratively, the etch proceeds through TaN cap layer 125 and freelayer 120 and stops on the barrier layer 115, using, for example, a chlorine-based reactive etch chemistry masked by the mandrel structure 60 or alternative conductive hardmask. Another option would employ a similar etch chemistry to etch the freelayer 120, barrier layer 115 and pinned layer 110, stopping on or in the pinning layer 105 that is the next level in the composite layer 110. The etch chamber process conditions are adjusted together with plasma emission spectroscopy measurements to facilitate an endpoint signal for an etch stop on the particular layer. The freelayer 120 and barrier layer 115 are about forty and ten Angstroms thick, respectively, requiring etch selectivity control to achieve the stop on the barrier in addition to the previous process controls. The result is shown in FIG. 3, with the upper layers of the magnetic stack patterned.

An important problem addressed by the invention is that of current leakage along these stack edges and also direct shorting of the barrier layer 115, which are caused in prior art fabrication by sputtering of metal from the pinned layer 110 or pinning layer. The sidewall redeposition is more of a problem with the crosspoint device structure since copper, which has a high sputter yield, is exposed during the metal stack etch.

Figure 4:
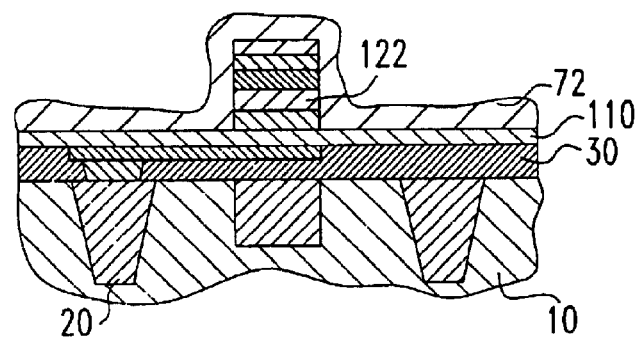
Figure 5:
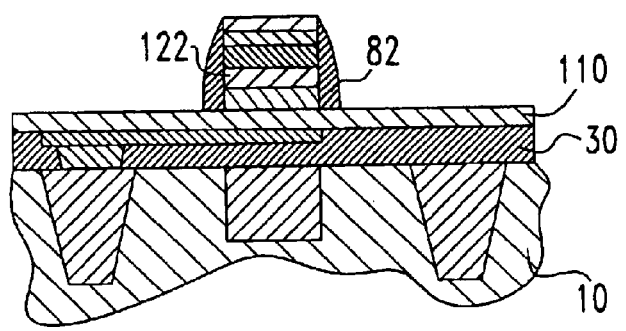

With the hardmask mandrel 60 and tunnel barrier of the magneto resistive device patterned, as illustrated in FIG. 3, a blanket dielectric layer 72 such as SiN, Al2O3, or other material that can be deposited at a temperature compatible with back end processing and can be removed with a directional etch, is conformally deposited on the wafer as shown in FIG. 4. The properties of the material are designed to minimize the leakage current along the device sidewalls, in addition to optimizing device characteristics such as reliability. This layer is then etched with a suitable fluorine-based dielectric etch chemistry available in commercial etch tooling to form the passivation sidewall spacer 82 shown in FIG. 5. After the sidewall formation, layer 110 is etched outside the sidewall spacer 82, leaving the structure shown in FIG. 6, with the cell stack having sidewall spacer 82 that rests on horizontal projections of layer 112, formed from the composite pinned layer.

Advantageously, the stack material at the edges of the free and tunnel layers is passivated by dielectric 72 and/or the material of sidewalls 82. Any sputtering from the exposed surfaces of pinned ferromagnetic layer 110, the pinning layer 105, the buffer layer 101, or metal 42 will not deposit on the exposed edges of layers 122 and 117 because of the protective effect of sidewalls 82.

Figure 6:
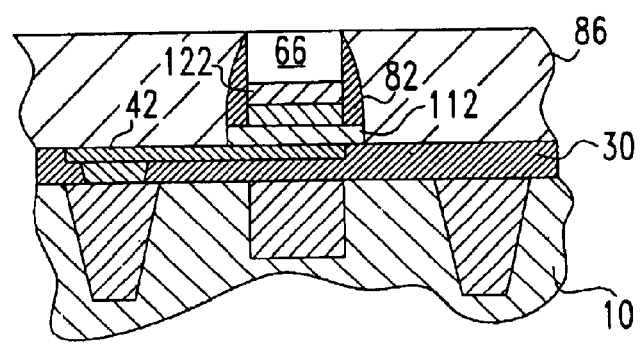

The mandrel hardmask structure 60 with the sidewall spacer 82 formed around the perimeter of the device, illustrated in FIG. 6, is then used to complete the metal etch process for the particular device. For the offset device illustrated herein, the additional etch process involves etching through pinned layer 110 stopping on or in the pinning layer. This results in formation of the shaped layers 122, 117 and 112, shown also in FIG. 6. It may also be desirable to etch through the pinning layer 105, stopping on the TaN buffer layer 101 at the bottom of composite layer 110. Another option is to etch through the pinned layer 110, the pinning layer 105 and the TaN buffer layer 101. This last method is preferably used to pattern the crosspoint device or the offset device using a damascene wiring strap 42 illustrated in FIG. 1. The wiring strap is formed prior to deposition of magnetic layer 100. Any of these options can be used for the offset device structure with appropriate modifications to the device structure. Following patterning of the device junction, the offset cell might require, depending on the etch option chosen from the previous paragraph, an additional lithography and metal etch step for the formation of the local wiring strap.

Figure 7:
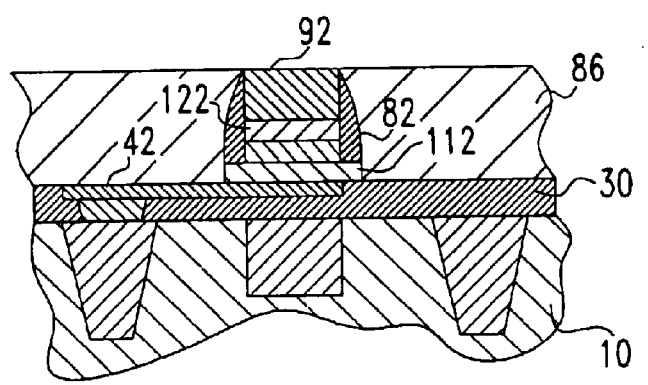

Referring now to FIG. 6, a relatively thick dielectric layer 86 is deposited over the entire structure, including the space between cells, to a depth sufficient to allow for formation of a contact. Excess amounts of layer 86 are removed to expose the top surface of mandrel 60. The mandrel is removed in a conventional dielectric etch, leaving an aperture 66 having layer 122 (the top layer of the magnetic stack 100) on its bottom, that will be filled with an electrode for the cell. Illustratively, the etch is made using a oxygen based plasma strip process, with substantial selectivity to the cap layer material 122. As shown in FIG. 7, a layer of copper is deposited to form electrode 92.

Illustratively, final dielectric 86 is SiLK(TM) or other low-k material for a high-performance integrated circuit. Other conventional interlayer dielectric materials could be used, as well, especially if high switching speed is not required in the particular application.

Figure 8:
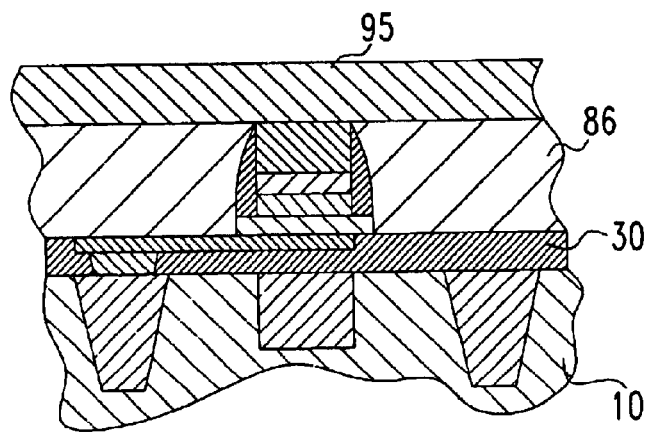

A final structure is shown in FIG. 8, in which a second metal layer 95 has been deposited and planarized, making contact with electrode 92. Those skilled in the art will be aware that the connections for the write currents for the cell have been omitted from these cross sections, (illustratively they extend perpendicular to the plane of the drawing), for clarity in presentation.

Those skilled in the art will be aware that many different combinations of materials may be used, so long as they are compatible with the etching material and other requirements. The substrate may be SiGe, GaAs or any other semiconductor. The cell has been shown as resting on the substrate, but may be formed at a higher level in the total integrated circuit structure. The structure of having the pinned layer on the bottom may be reversed with the free layer on the bottom and the pinned layer on the top. The electrical connections are preferably copper in a low-k dielectric, but may be aluminum in oxide or any other combination meeting the electrical requirements of the chip being fabricated. The chip may be a magnetic random access memory or may be a logic chip containing an array of memory cells in it.

While the invention has been described in terms of a single preferred embodiment, those skilled in the art will recognize that the invention can be practiced in various versions within the spirit and scope of the following claims.

What is claimed is:

1. A method of making at least one magnetic memory cell comprising the steps of:
    depositing a memory stack of magnetic materials containing a pinned layer, a free layer and a tunnel barrier layer disposed between said pinned layer and said tunnel layer;
    forming an etch-resistant mandrel defining at least one cell area of said memory stack;
    patterning at least one layer of said memory stack by etching outside said mandrel, leaving an exposed vertical surface of said at least one layer;
    forming substantially vertical protective sidewalls about said memory stack, covering said exposed vertical surface; and
    patterning at least one remaining layers of said memory stack, whereby said exposed vertical surface is protected during said step of patterning said remaining layers of said memory stack.

2. A method according to claim 1, in which said free layer is the top layer of said memory stack and said step of patterning comprises etching through said free layer and stopping the etch on said tunnel barrier layer.

3. A method according to claim 1, in which said free layer is the top layer of said memory stack and said step of patterning comprises etching through said free layer and said tunnel barrier layer and stopping the etch on said pinned layer.

4. A method according to claim 3, in which said free layer is the top layer of said memory stack and said step of patterning comprises etching through said free layer and said tunnel barrier layer and stopping the etch in a pinning layer that is a sublayer of a composite pinned layer.

5. A method according to claim 1, further comprising a step of depositing a conformal dielectric over said mandrel and etching said conformal dielectric directionally to form said protective sidewalls extending over edges of said free layer and tunnel barrier layer exposed by said step of etching.

6. A method according to claim 5, further comprising a step of etching through said pinned layer outside said sidewalls, whereby a pinned layer of said memory cell is formed that extends underneath said sidewalls and is self-aligned with said free layer and tunnel barrier layer and whereby exposed edges of said free layer and said tunnel barrier layer are protected from deposition of sputtered material during the etching process.

7. A method According to claim 6, further comprising a step of depositing an interlayer dielectric around said mandrel, thereby enclosing said sidewalls, up to a top level of said mandrel;
    removing said mandrel, exposing a top layer of said magnetic stack at the bottom of a mandrel aperture; and
    depositing a conductive material in said mandrel aperture, thereby forming a cell contact.

8. A method according to claim 2, further comprising a step of depositing a conformal dielectric over said mandrel and etching said conformal dielectric directionally to form said protective sidewalls extending over edges of said free layer and tunnel barrier layer exposed by said step of etching.

9. A method according to claim 8, further comprising a step of etching through said pinned layer outside said sidewalls, whereby a pinned layer of said memory cell is formed that extends underneath said sidewalls and is self-aligned with said free layer and tunnel barrier layer and whereby exposed edges of said free layer and said tunnel barrier layer are protected from deposition of sputtered material during the etching process.

10. A method according to claim 9, further comprising a step of depositing an interlayer dielectric around said mandrel, thereby enclosing said sidewalls, up to a top level of said mandrel;
    removing said mandrel, exposing a top layer of said magnetic stack at the bottom of a mandrel aperture; and
    depositing a conductive material in said mandrel aperture, thereby forming a cell contact.

* * * * *